US010770512B1

(12) United States Patent
Vega et al.

(10) Patent No.: US 10,770,512 B1
(45) Date of Patent: Sep. 8, 2020

(54) STACKED RESISTIVE RANDOM ACCESS MEMORY WITH INTEGRATED ACCESS TRANSISTOR AND HIGH DENSITY LAYOUT

(71) Applicant: INTERNATIONAL BUSINESS MACHINES CORPORATION, Armonk, NY (US)

(72) Inventors: Reinaldo Vega, Mahopac, NY (US); Takashi Ando, Tuckahoe, NY (US); Hari Mallela, Poughquag, NY (US); Li-Wen Hung, Mahopac, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/368,065

(22) Filed: Mar. 28, 2019

(51) Int. Cl.
*H01L 45/00* (2006.01)
*H01L 27/24* (2006.01)
*G11C 13/00* (2006.01)

(52) U.S. Cl.
CPC ........ *H01L 27/2481* (2013.01); *G11C 13/003* (2013.01); *G11C 13/004* (2013.01); *G11C 13/0026* (2013.01); *G11C 13/0028* (2013.01); *G11C 13/0069* (2013.01); *H01L 45/1608* (2013.01); *H01L 45/1683* (2013.01); *G11C 13/0011* (2013.01); *G11C 2013/009* (2013.01); *G11C 2013/0045* (2013.01); *G11C 2013/0078* (2013.01); *G11C 2213/11* (2013.01); *G11C 2213/71* (2013.01); *G11C 2213/79* (2013.01); *H01L 45/08* (2013.01)

(58) Field of Classification Search
CPC .................................................. H01L 45/1233
See application file for complete search history.

(56) References Cited

U.S. PATENT DOCUMENTS 8,279,650 B2   10/2012   Yan et al.
8,846,484 B2    9/2014   Lee et al.
(Continued)

OTHER PUBLICATIONS

Geoffrey W. Burr et al., "Access devices for 3D crosspoint memory," Journal of Vacuum Science & Technology B, vol. 32, No. 4, 2014, 040802, 23 pp.
(Continued)

*Primary Examiner* — Peniel M Gumedzoe
*Assistant Examiner* — Christopher A Johnson
(74) *Attorney, Agent, or Firm* — Cantor Colburn LLP; Erik Johnson (57) ABSTRACT

A stacked resistive random access memory (ReRAM) structure is provided. The stacked ReRAM structure includes a channel, a ReRAM cell sub-structure and a contact via sub-structure. The ReRAM cell structure includes ReRAM cell, drain, gate and source layers, which are insulated from one another and respectively disposed in operative contact with the channel. The contact via sub-structures includes first, second, third and fourth contact vias, which are separate from one another. The first contact via is disposed in exclusive operative contact with the ReRAM cell layer. The second contact via is disposed in exclusive operative contact with the drain layer. The third contact via is disposed in exclusive operative contact with the gate layer. The fourth contact via is disposed in exclusive operative contact with the source layer.

10 Claims, 6 Drawing Sheets

(56) References Cited

U.S. PATENT DOCUMENTS

| | | |
|---|---|---|
| 9,136,307 B2 | 9/2015 | Pellizzer |
| 9,331,275 B2 * | 5/2016 | Sandhu |
| 9,412,940 B2 * | 8/2016 | Sacchetto .......... G11C 13/0007 |
| 9,741,765 B1 | 8/2017 | Narayanan et al. |
| 2015/0021537 A1 | 1/2015 | Xiet et al. |

OTHER PUBLICATIONS

H.-S. Philip Wong et al., "Metal-oxide RRAM," Proceedings of the IEEE, vol. 100, No. 6, 2012, pp. 1951-1970.
I. G. Baek et al., "Realization of Vertical Resistive Memory (VRRAM) Using Cost Effective 3D Process," IEEE International Electron Devices Meeting, IEDM, 2011, pp. 737-740.
T. Gokmen and Y. Vlasov, "Acceleration of Deep Neural Network Training with Resistive Cross-Point Devices: Design Considerations," Frontiers in Neuroscience, vol. 10, Article 333, 2016, 13 pp.
Z. Fang et al., "Fully CMOS-compatible 1T1R integration of vertical nanopillar GAA transistor and oxide-based RRAM cell for high-density nonvolatile memory application," IEEE Transactions on Electron Devices, vol. 60, No. 3, 2013, pp. 1108-1113.

* cited by examiner

STACKED RESISTIVE RANDOM ACCESS MEMORY WITH INTEGRATED ACCESS TRANSISTOR AND HIGH DENSITY LAYOUT

BACKGROUND

The present invention generally relates to fabrication methods and resulting structures for semiconductor devices. More specifically, the present invention relates to a stacked resistive random access memory (ReRAM) structure with an integrated access transistor and a high density layout for neuromorphic computing.

ReRAM structures can be used as a type of non-volatile (NV) random-access memory (RAM) in computing resources. ReRAM typically operates by controlled changes in resistance across a dielectric solid-state material. The dielectric solid-state material can be referred to as a "memristor."

SUMMARY

Embodiments of the present invention are directed to a stacked ReRAM structure. A non-limiting example of the stacked ReRAM structure includes a channel, a ReRAM cell sub-structure and a contact via sub-structure. The ReRAM cell structure includes ReRAM cell, drain, gate and source layers which are insulated from one another and respectively disposed in operative contact with the channel. The contact via sub-structures includes first, second, third and fourth contact vias which are separate from one another. The first contact via is disposed in exclusive operative contact with the ReRAM cell layer. The second contact via is disposed in exclusive operative contact with the drain layer. The third contact via is disposed in exclusive operative contact with the gate layer. The fourth contact via is disposed in exclusive operative contact with the source layer.

Embodiments of the present invention are directed to stacked ReRAM structure with a dense layout. A non-limiting example of the stacked ReRAM structure includes a channel with multiple edges, a ReRAM cell sub-structure and an individual contact via sub-structure at each of the multiple edges. The ReRAM cell sub-structure includes ReRAM cell, drain, gate and source layers which are insulated from one another and respectively disposed in operative contact with the channel. Each of the individual contact via sub-structures respectively includes first, second, third and fourth contact vias which are separate from one another. The first contact via is disposed in exclusive operative contact with the ReRAM cell layer. The second contact via is disposed in exclusive operative contact with the drain layer. The third contact via is disposed in exclusive operative contact with the gate layer. The fourth contact via is disposed in exclusive operative contact with the source layer.

Embodiments of the invention are directed to a method of fabricating a stacked ReRAM structure. A non-limiting example of the method includes forming a channel, layering a ReRAM cell sub-structure and building a contact via sub-structure. The layering of the ReRAM cell sub-structure is executed such that the ReRAM cell sub-structure includes ReRAM cell, drain, gate and source layers which are insulated from one another and respectively disposed in operative contact with the channel. The building of the contact via sub-structure is executed such that the contact via sub-structure includes first, second, third and fourth contact vias which are separate from one another. The first contact via is disposed in exclusive operative contact with the ReRAM cell layer. The second contact via is disposed in exclusive operative contact with the drain layer. The third contact via is disposed in exclusive operative contact with the gate layer. The fourth contact via is disposed in exclusive operative contact with the source layer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, in a ReRAM structure, a dielectric is provided as a normally insulating element but is made to conduct electricity through one or more filaments or conduction paths that are formed after an application of a sufficiently high voltage. The one or more filaments or conduction paths can arise from different mechanisms, including vacancy or metal defect migration. Once the one or more filaments or conduction paths are formed, they may be reset (i.e., broken, resulting in high resistance) or set (i.e., re-formed, resulting in lower resistance) by another application of voltage.

Three dimensionally stacked ReRAM structures can be provided and typically include one or more ReRAM cells. Known methods for building such three-dimensionally stacked ReRAM structures do not possess the capacity or ability to include or provide for connections between one selector device and each individual ReRAM cell in the three-dimensionally stacked ReRAM structure. Instead, one selector device usually represents an entire wordline of cells. This is analogous to having one passgate per wordline in an eDRAM array when one passgate per eDRAM cell in a wordline is desired.

Turning now to an overview of the aspects of the invention, one or more embodiments of the invention address the above-described shortcomings of the prior art by providing for a ReRAM structure in which a dedicated selection transistor is integrated into a memory cell. The ReRAM structure includes a ReRAM cell structure in which ReRAM cell, drain, gate and source layers are insulated from one another and respectively contact a channel. The ReRAM structure further includes a contact via sub-structures in which first, second, third and fourth contact vias are separate from one another. The first contact via contacts the ReRAM cell layer, the second contact contacts the drain layer, the third contact via contacts the gate layer and the fourth contact via contacts the source layer.

The above-described aspects of the invention address the shortcomings of the prior art by providing for a three-dimensionally stacked ReRAM structure with one or more ReRAM cells in which connections are each respectively disposed between one selector device and each individual ReRAM cell. This configuration stands in contrast to conventional configurations in which one selector device represents an entire wordline of cells, such as where one passgate is provided per wordline in an eDRAM array.

Figure 1:
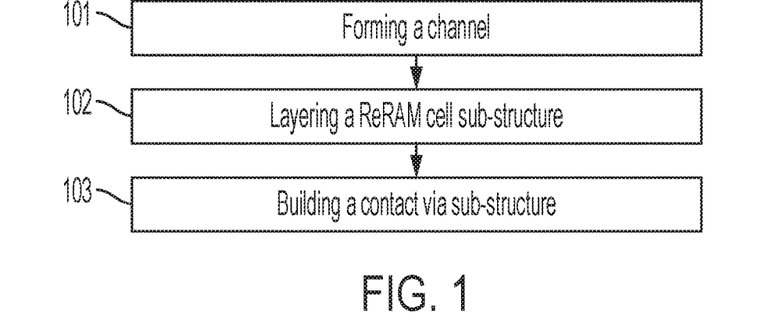
FIG. 1 depicts a method of fabricating a ReRAM structure in accordance with embodiments of the present invention.

Turning now to a more detailed description of aspects of the present invention, FIG. 1 depicts a flow diagram illustrating a method of fabricating a stacked ReRAM structure. As shown in FIG. 1, the method includes forming a channel (101), layering a ReRAM cell sub-structure (102) and building a contact via sub-structure (103). In accordance with embodiments of the present invention, the layering of the ReRAM cell sub-structure of operation 102 is executed such that the ReRAM cell sub-structure includes a ReRAM cell layer, a drain layer, a gate layer and a source layer. The ReRAM cell layer, the drain layer, the gate layer and the source layer are insulated from one another and are respectively disposed in operative contact with the channel. In accordance with embodiments of the present invention, the building of the contact via sub-structure of operation 103 is executed such that the contact via sub-structure includes a first contact via, a second contact via, a third contact via and a fourth contact via. The first contact via, the second contact via, the third contact via and the fourth contact via are separate from one another. The first contact via is disposed in exclusive operative contact with the ReRAM cell layer. The second contact via is disposed in exclusive operative contact with the drain layer. The third contact via is disposed in exclusive operative contact with the gate layer. The fourth contact via is disposed in exclusive operative contact with the source layer.

Further details of the method will now be described with reference to FIGS. 2-12.

Figure 2:
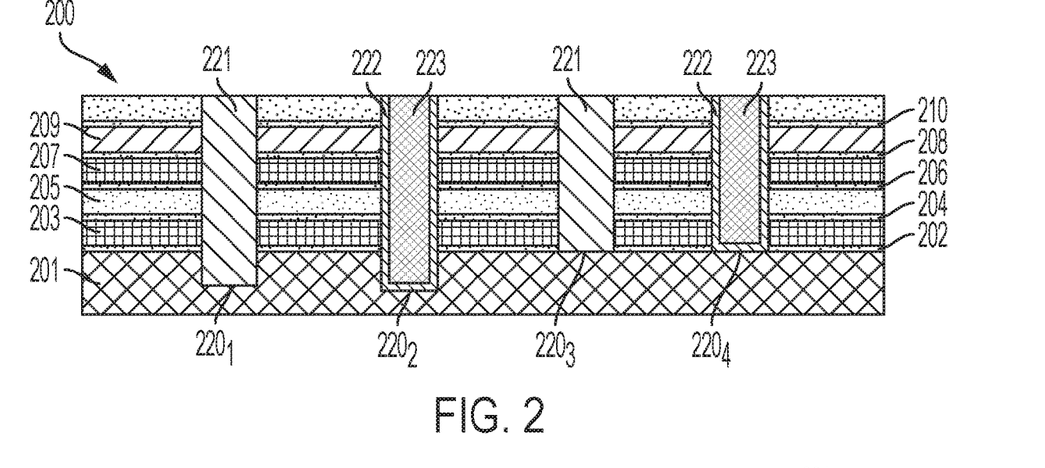
FIG. 2 is a schematic side view of an initial structure with trenches etched therein and filled with channel material to be fabricated into a stacked ReRAM structure in accordance with embodiments of the present invention.

As shown in FIG. 2, an initial structure 200 is formed and includes a substrate 201, a first nitride layer 202 disposed over the substrate 201, a first oxide layer 203 disposed over the first nitride layer 202, a second nitride layer 204 disposed over the first oxide layer 203, a poly-silicon (poly-Si) layer 205 disposed over the second nitride layer 204, a third nitride layer 206 disposed over the poly-Si layer 105, a second oxide layer 207 disposed over the third nitride layer 106, a fourth nitride layer 208 disposed over the second oxide layer 207, a poly-silicon germanium (poly-SiGe) layer 209 disposed over the fourth nitride layer 208 and a fifth nitride layer 210 disposed over the poly-SiGe layer 209.

A first trench 220 is etched into the initial structure 200 for enabling channel region formation. The first trench 220 can be etched in accordance with multiple embodiments of the present invention. For example, in a first embodiment of the present invention, first trench $220_1$ extends from the fifth nitride layer 210 to an interior of the substrate 201 and includes channel material 221, such as molybdenum sulfide ($MoS_2$), which has been deposited therein. As another example, in a second embodiment of the present invention, first trench $220_2$ extends from the fifth nitride layer 210 to the interior of the substrate 201 and includes dielectric liner material deposited therein to form a liner 222 and epitaxially grown channel material 223, such as Si, SiGe, etc., which is epitaxially grown within the liner 222. As another example, in a third embodiment of the present invention, first trench 220₃ extends from the fifth nitride layer 210 to an uppermost surface of the substrate 201 and includes the channel material 221. As yet another example, in a fourth embodiment of the present invention, first trench 220₄ extends from the fifth nitride layer 210 to the uppermost surface of the substrate 201 and includes the dielectric liner material deposited therein to form the liner 222 and the epitaxially grown channel material 223 that is epitaxially grown within the liner 222.

The following description will generally relate to the third embodiment of the present invention described above although the first trench 220₃ will be referred to simply as the first trench 220. This is being done for purposes of clarity and brevity and should not be read or interpreted in a manner that would otherwise limit the scope of the following description or the claims.

Figure 3:
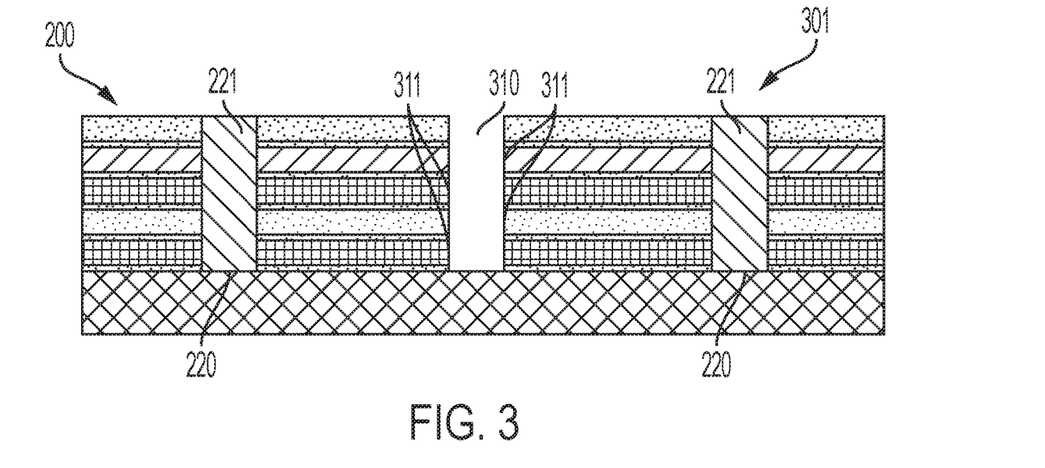
FIG. 3 is a schematic side view of the initial structure with a second trench etched between channel materials in accordance with embodiments of the present invention.

As shown in FIG. 3, an initial or preliminary structure 301 of a stacked ReRAM structure is provided with the initial structure 200, first trenches 220 etched therein and filled with the channel material 221 and a second trench 310 etched therein between the first trenches 220. The second trench 310 can be etched by an etching process, such as a reactive ion etch (ME), and extends from the fifth nitride layer 210 to an uppermost surface of the substrate 201 and exposes dummy material sidewalls 311 that serves to provide access to release regions.

Figure 4:
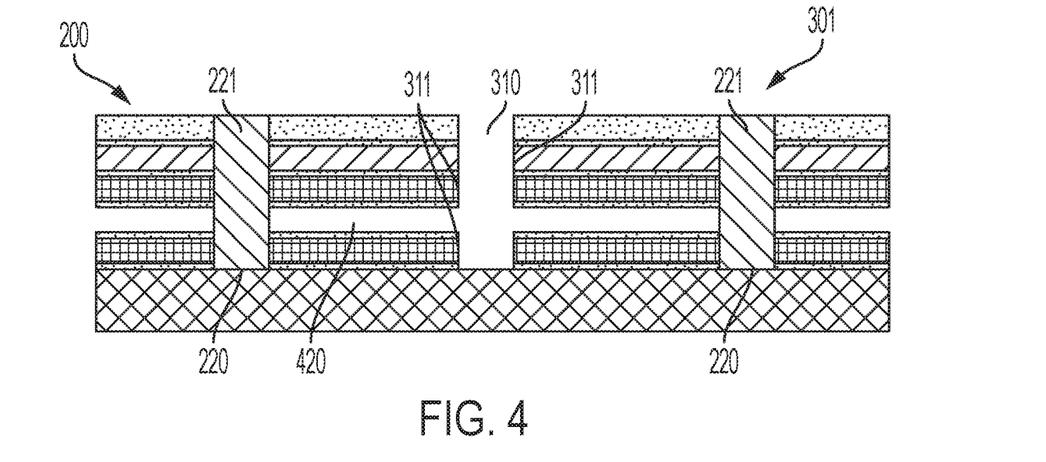
FIG. 4 is a schematic side view of an intermediate structure with a dummy gate removed via the second trench in accordance with embodiments of the present invention.

As shown in FIG. 4, once the second trench 310 is etched, a dummy gate removal operation can be executed by way of the second trench 310 by a subway etch process. This subway etch process removes the poly-Si layer 205 and results in a first release region 420.

Figure 5:
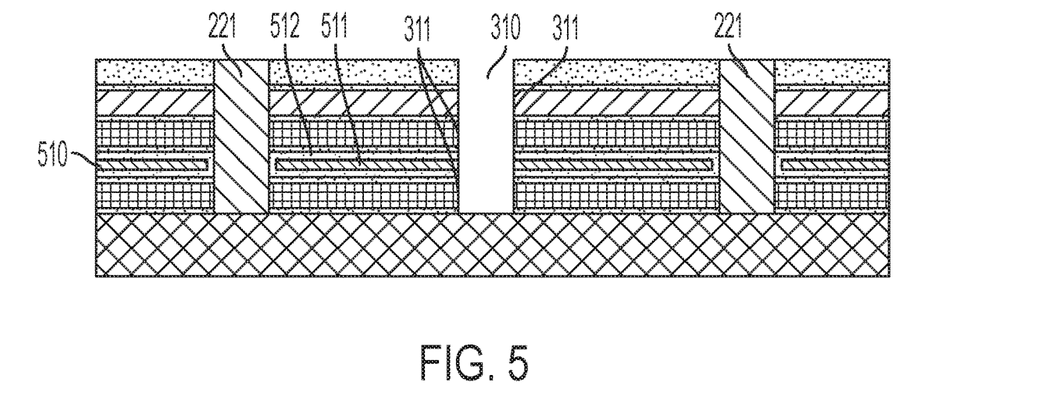
FIG. 5 is a schematic side view of an intermediate structure following gate formation and the second trench being re-etched in accordance with embodiments of the present invention.

As shown in FIG. 5, a replacement metal gate process is executed to form a gate layer 510 in the first release region 420 of FIG. 4 and is followed by an etching process, such as ME, to re-open the second trench 310 to thus re-expose the dummy material sidewalls 311. The gate layer 510 includes one or more layers of metal gate material 511 and dielectric material 512 surrounding the metal gate material 511. In accordance with embodiments of the present invention, depending on a composition of the channel material 221, the dielectric material 512 can include a combination of high-k dielectric and inter layer dielectric materials or, alternately, high-k dielectric material only.

Figure 6:
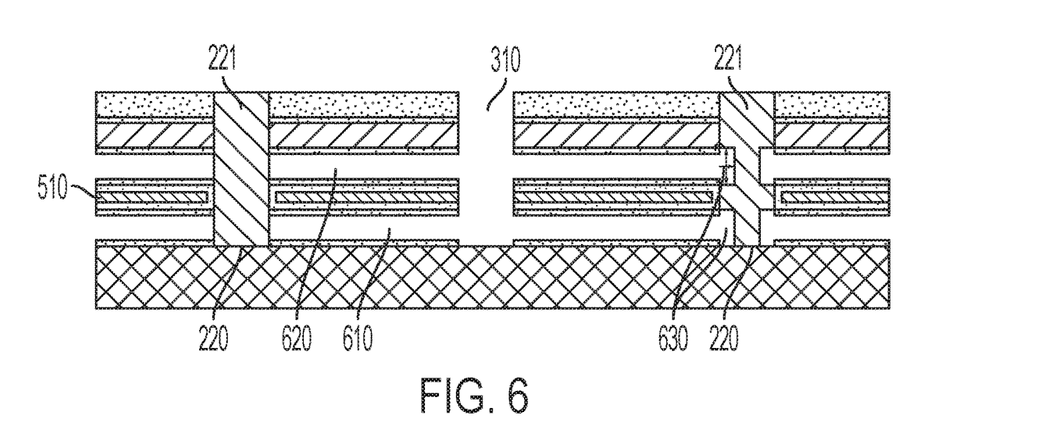
FIG. 6 is a schematic side view of an intermediate structure with dummy source/drain layers removed via the second trench in accordance with embodiments of the present invention.

As shown in FIG. 6, once the second trench 310 is re-opened, a dummy source/drain removal operation can be executed by way of the second trench 310 by a subway etch process. This subway etch process removes the first oxide layer 203 and the second oxide layer 207 and results in a second release region 610 and a third release region 620. In accordance with embodiments of the present invention, the subway etch process can laterally etch a cavity 630 into the channel material 221 of one or more of the first trenches 220 which is exposed by the removal of dummy source/drain regions. This will result in source/drain junctions (doped or metallic) being in closer proximity to the resulting gate edge.

The following description will generally relate to the embodiment of the present invention described above in which the subway etch process removes the first oxide layer 203 and the second oxide layer 207 but the cavity 630 is not formed. This is being done for purposes of clarity and brevity and should not be read or interpreted in a manner that would otherwise limit the scope of the following description or the claims.

Figure 7:
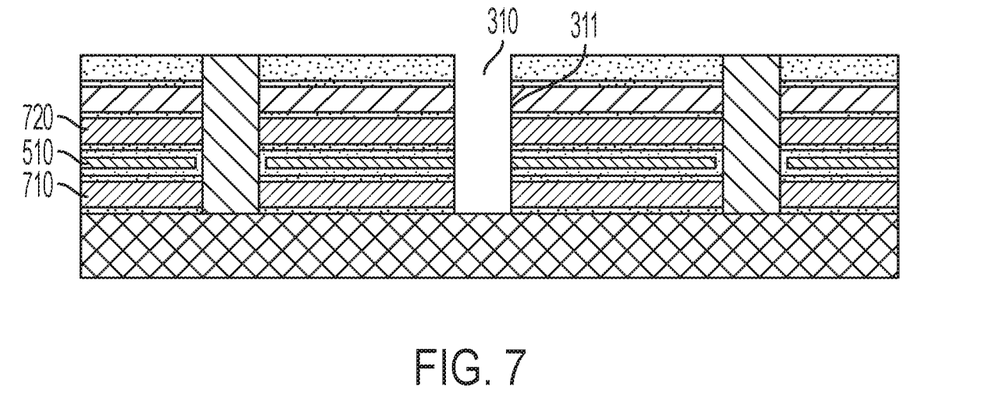
FIG. 7 is a schematic side view of an intermediate structure following source/drain layer refills and the second trench being re-etched in accordance with embodiments of the present invention.

As shown in FIG. 7, a replacement source/drain process is executed to form a source layer 710 in the second release region 610 and a drain layer 720 in the third release region 620 and is followed by an etching process, such as RIE, to re-open the second trench 310 to thus re-expose the dummy material sidewalls 311. The source layer 710 and the gate layer 720 includes one or more metallic materials.

Figure 8:
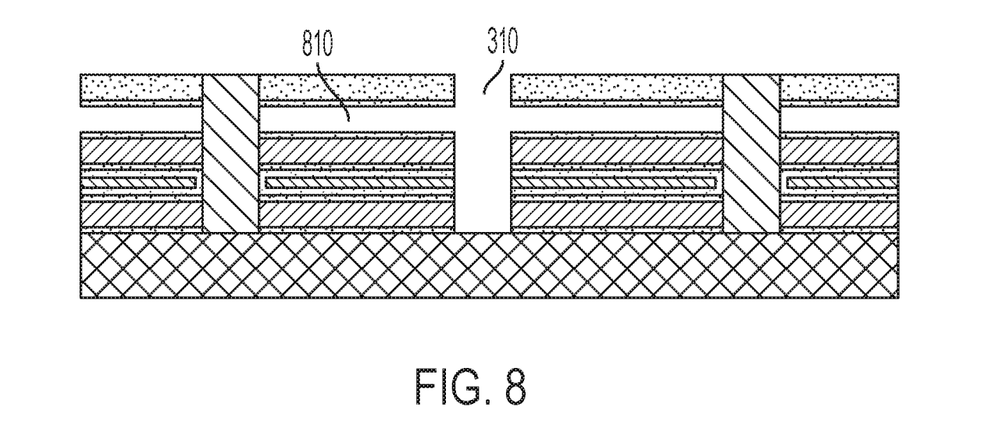
FIG. 8 is a schematic side view of an intermediate structure with a dummy gate removed via the second trench in accordance with embodiments of the present invention.

As shown in FIG. 8, once the second trench 310 is re-opened, a dummy gate removal operation can be executed by way of the second trench 310 by a subway etch process. This subway etch process removes the poly-SiGe layer 209 and results in a fourth release region 810.

Figure 9:
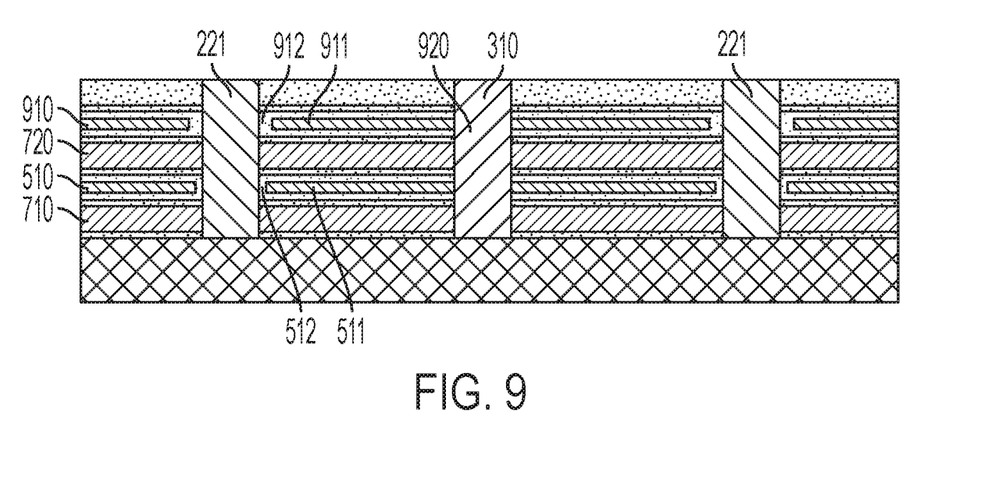
FIG. 9 is a schematic side view of an intermediate structure following ReRAM layer formation and the second trench being re-etched and filled in accordance with embodiments of the present invention.

As shown in FIG. 9, a ReRAM formation process is executed to form a ReRAM cell layer 910 in the fourth release region 810 and is followed by an etching process, such as ME, to re-open the second trench 310 to thus re-expose the dummy material sidewalls 311. This is followed by an organic planarization layer (OPL) material fill process and a chemical mechanical polishing (CMP) process to form a contact filler 920 in the second trench 310. The ReRAM cell layer 910 includes one or more layers of metal gate material 911 and dielectric material 912 surrounding the metal gate material 911. In accordance with embodiments of the present invention, depending on a composition of the channel material 221, the dielectric material 912 can include a combination of high-k dielectric and inter layer dielectric materials or, alternately, high-k dielectric material only. In accordance with further embodiments of the present invention, a thickness (~4 nm) of the dielectric material 912 between the metal gate material 911 and the channel material 221 in the ReRAM cell layer 910 is thicker than a thickness (~2 nm) of the dielectric material 512 between the metal gate material 511 and the channel material 221 in the gate layer 510.

Figure 10:
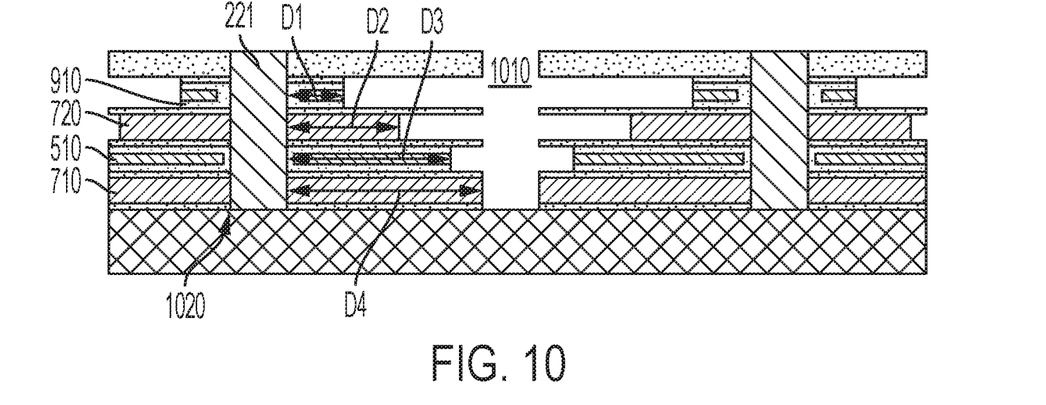
FIG. 10 is a schematic side view of an intermediate structure following a multi-step organic planarization layer (OPL) recess and isotropic etch-back of exposed layers to result in a ReRAM cell sub-structure in accordance with embodiments of the present invention.

As shown in FIG. 10, a multi-step OPL recess process is executed to remove the contact filler 920 in the second trench 310 and is followed by an isotropic etch-back of the exposed surfaces of the gate layer 510, the drain layer 720 and the ReRAM cell layer 910 that results in a step-wise opening 1010. This isotropic etch-back results in the ReRAM cell layer 910 extending outwardly from the channel material 221 by a first distance D1, the drain layer 720 extending outwardly from the channel material 221 by a second distance D1 that exceeds the first distance D1 and the gate layer 510 extending outwardly from the channel material 221 by a third distance D3 that exceeds the second distance D2. The source layer 710, which is not subject to the isotropic etch-back process, extends outwardly from the channel material 221 by a fourth distance D4 that exceeds the third distance D3.

The layered structure resulting from the multi-step OPL recess process illustrated in FIG. 10 is a ReREM cell sub-structure 1020.

Figure 11:
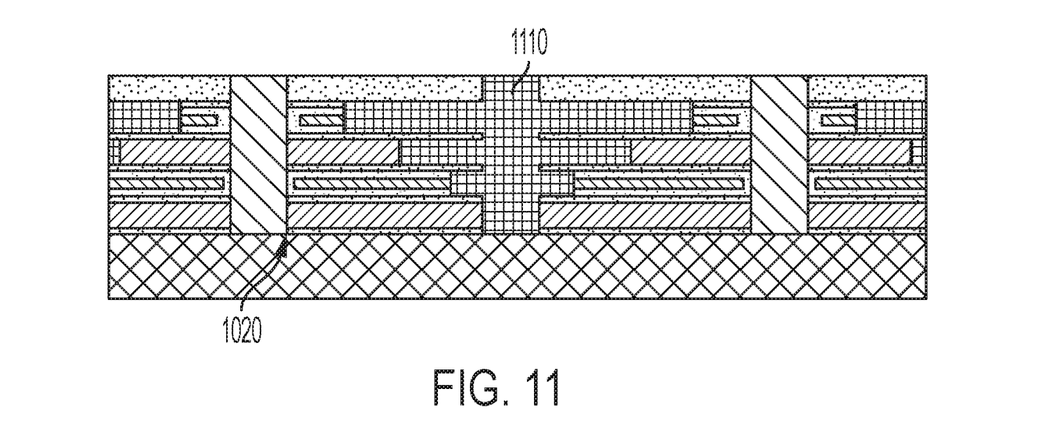
FIG. 11 is a schematic side view of an intermediate structure following an OPL fill in accordance with embodiments of the present invention.

As shown in FIG. 11, a dielectric fill operation is executed to fill the step-wise opening 1010 with dielectric material 1110.

Figure 12:
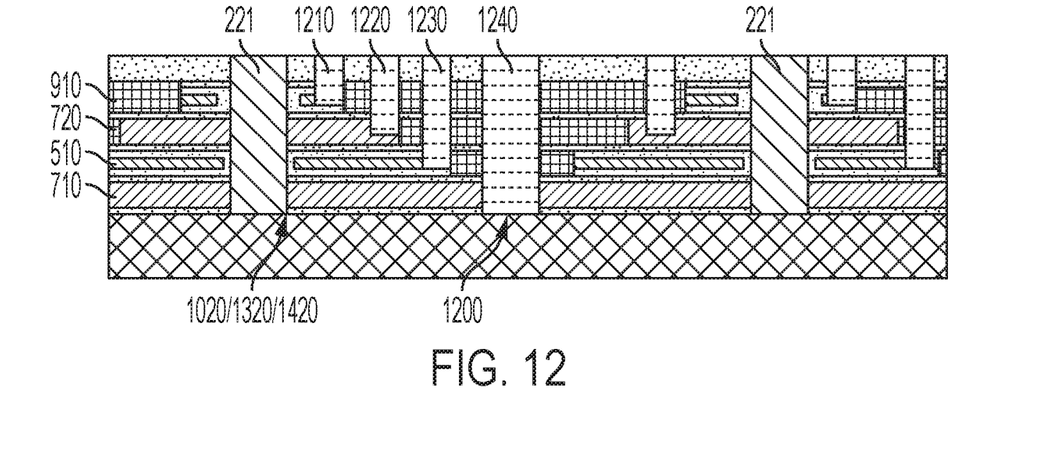
FIG. 12 is a schematic side view of a late stage structure with a ReRAM cell sub-structure and a contact via sub-structure in accordance with embodiments of the present invention.

As shown in FIG. 12, a contact via sub-structure 1200 is built. The contact via sub-structure 1200 includes a first contact via 1210, a second contact via 1220, a third contact via 1230 and a fourth contact vias 1240 that are all separate from one another. The first contact via 1210 is disposed in exclusive operative contact with the ReRAM cell layer 910, the second contact via 1220 is disposed in exclusive operative contact with the drain layer 720, the third contact via 1230 is disposed in exclusive operative contact with the gate layer 510, and the fourth contact via 1240 is disposed in exclusive operative contact with the source layer 710.

In accordance with embodiments of the present invention, the left side of the illustration in FIG. 12 shows that the contact via sub-structure 1200 can be built entirely on one side of the channel material 221 while the other side can be used for another or separate device. This option can be leveraged to increase memory density. In accordance with alternative embodiments of the invention, the contact via sub-structure 1200 can be built on both sides of the channel material 221 assuming both sides are part of a same device (e.g., the channel material 221 is contained in a circular trench surrounded by a coaxial gate). This option can be leveraged to increase via spacing to enable operating voltage margins.

Figure 13:
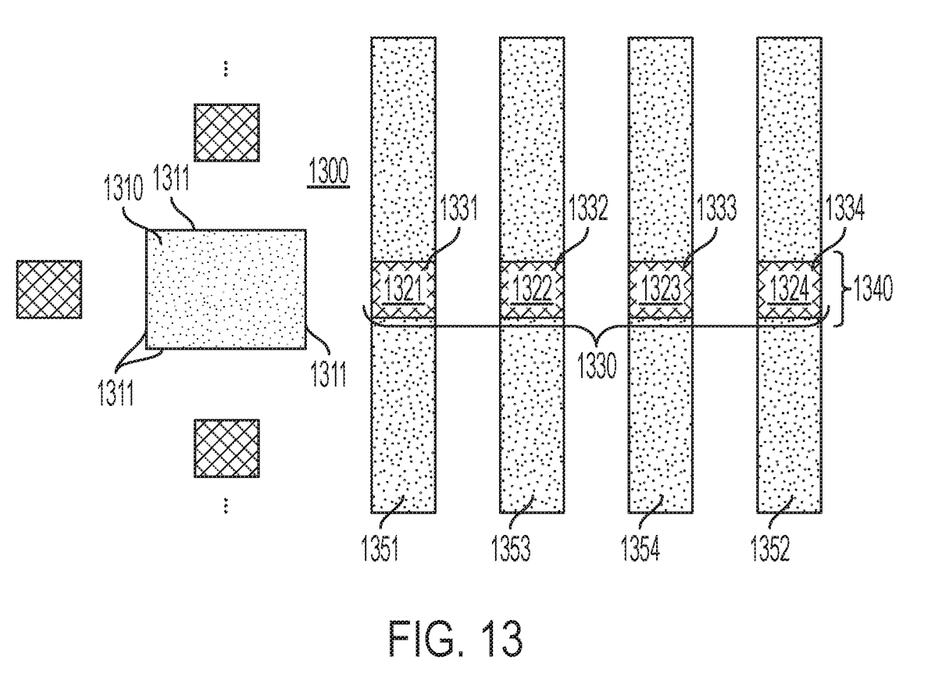
FIG. 13 is a schematic top-down view of an arrangement of contact vias in accordance with embodiments of the present invention.

With reference to FIG. 13, a stacked ReRAM structure 1300 is fabricated as described above and includes a channel 1310 with multiple edges 1311, a ReRAM cell sub-structure 1320 (see FIG. 12) and a contact via sub-structure 1330. The channel 1310 includes one of deposited channel material, epitaxially grown channel material and epitaxially grown channel material surrounded by a liner. The ReRAM cell sub-substructure 1320 includes a ReRAM cell layer 1321, a drain layer 1322, a gate layer 1323 and a source layer 1324 as described above (see FIG. 10 and the accompanying text) which are insulated from one another and which are respectively disposed in operative contact with the channel 1310. The contact via sub-structure 1330 includes a first contact via 1331, a second contact via 1332, a third contact via 1333 and a fourth contact via 1334 as described above (see FIG. 12 and the accompanying text) which are separate from one another. The first contact via 1331 is disposed in exclusive operative contact with the ReRAM cell layer 1321, the second contact via 1332 is disposed in exclusive operative contact with the drain layer 1322, the third contact via 1333 is disposed in exclusive operative contact with the gate layer 1323, and the fourth contact via 1334 is disposed in exclusive operative contact with the source layer 1324.

Although it is not specifically illustrated in FIG. 13, each of the ReRAM cell layer 1321, the drain layer 1322, the gate layer 1323 and the source layer 1324 extends outwardly from each of the multiple edges 1311 of the channel 1310 with successively increasing distances. Correspondingly, the contact via sub-structure 1330 can be provided as an individual contact via sub-structure 1330 with a linear formation 1340 at each of the multiple edges 1311.

Figure 14:
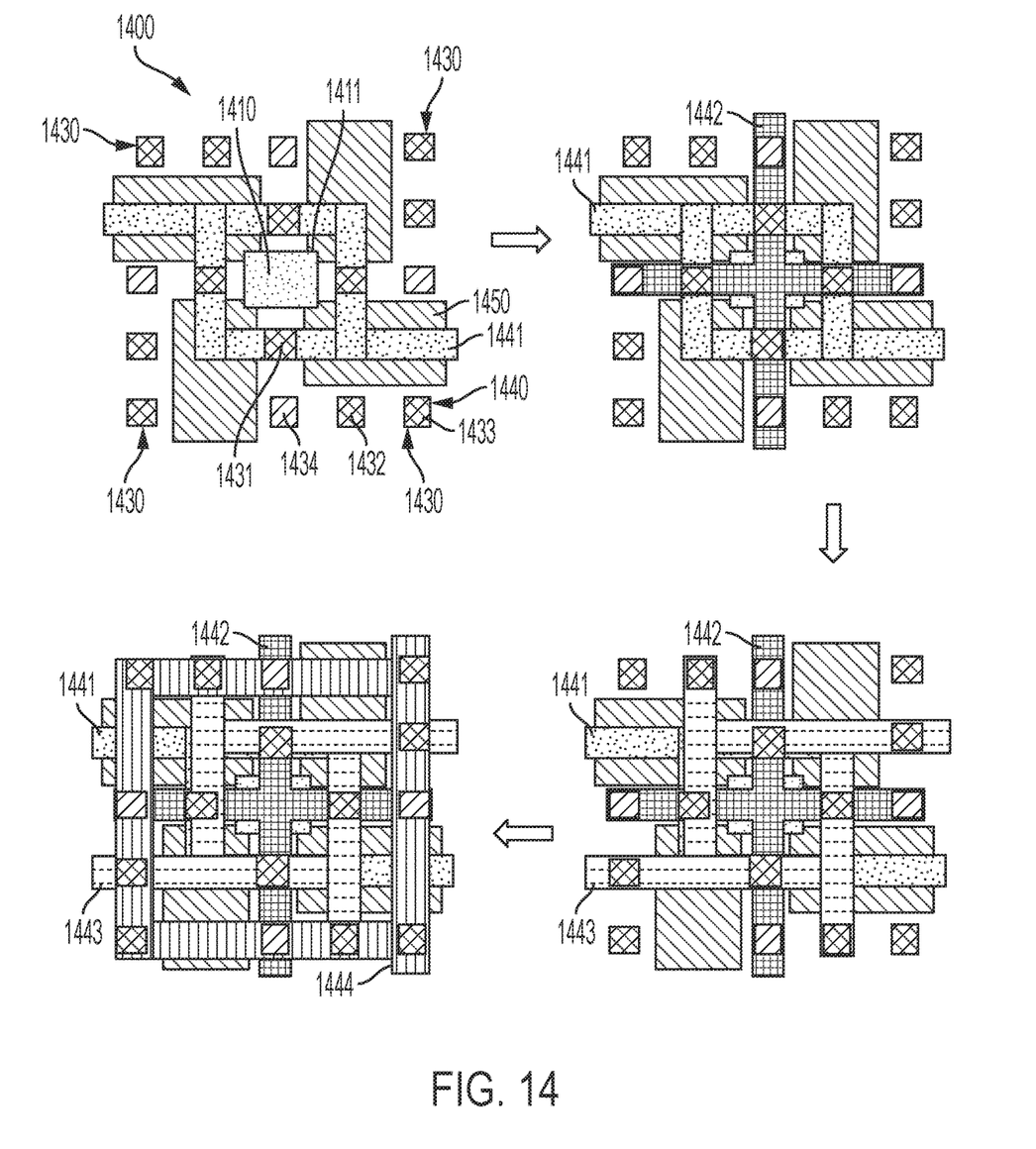
FIG. 14 is a schematic top-down view of dense arrangements of contact vias in accordance with embodiments of the present invention.

The stacked ReRAM structure 1300 can further includes a word line 1351, which is disposed in operative contact with the first contact via 1331, a first bit line 1352, which is disposed in operative contact with the fourth contact via 1334, a second bit line 1353, which is disposed in operative contact with the second contact via 1332, and a gate line 1354, which is disposed in operative contact with the third contact via 1333 (the word line 1351, the first bit line 1352, the second bit line 1353 and the gate line 1354 can each be disposed in operative contact with the corresponding features of each of the individual contact via sub-structures 1330 at each of the multiple edges 1311 as shown in a different configuration of FIG. 14 to be described below).

As shown in FIG. 14, a stacked ReRAM structure 1400 is provided with a dense layout. The stacked ReRAM structure 1400 is constructed similarly as the stacked ReRAM structure 1300 of FIG. 13 and includes a channel 1410 with multiple edges 1411, a ReRAM cell sub-structure 1420 (see FIG. 12) and individual contact via sub-structures 1430 at each of the multiple edges 1411. Each individual contact via sub-structure 1430 has a first contact via 1431, a second contact via 1432, a third contact via 1433 and a fourth contact via 1434. Each individual contact via sub-structure 1430 can have a spiral formation 1440. An insulating body 1450 can be interposed between neighboring individual contact via sub-structures 1430.

The stacked ReRAM structure 1400 can further include a word line 1441, which is disposed in operative contact with each of the first contact vias 1431 of each of the individual contact via sub-structures 1430, a first bit line 1442, which is disposed in operative contact with each of the fourth contact vias 1434 of each of the individual contact via sub-structures 1430, a second bit line 1443, which is disposed in operative contact with each of the second contact vias 1432 of each of the individual contact via sub-structures 1430, and a gate line 1444, which is disposed in operative contact with each of the third contact vias 1433 of each of the individual contact via sub-structures 1430.

For stacked ReRAM structures, such as the stacked ReRAM structures 1300 and 1400 of FIGS. 13 and 14, current and voltage driven write operations and a read operation are possible. The current driven write operation can include biasing the gate line 1354/1444, biasing the word line 1351/1441 and the first bit line 1352/1442 and forcing the second bit line 1353/1443 to zero current or to have a same bias as the word line 1351/1441. The voltage driven write operation can include grounding the gate line 1354/1444 and the first bit line 1352/1442 and applying positive and negative biases to the word line 1351/1441 and the second bit line 1353/1443, respectively. The read operation can include a grounding of the gate line 1354/1444 and the first bit line 1352/1442, a biasing of the word line 1351/1441 and a reading of a current of the second bit line 1353/1443.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one"

and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a stacked resistive random access memory (ReRAM) structure, the method comprising:
   forming a channel;
   layering a ReRAM cell sub-structure comprising ReRAM cell, drain, gate and source layers, which are insulated from one another and respectively disposed in operative contact with the channel; and
   building a contact via sub-structure comprising first, second, third and fourth contact vias, which are separate from one another, the first contact via being disposed in exclusive operative contact with the ReRAM cell layer, the second contact via being disposed in exclusive operative contact with the drain layer, the third contact via being disposed in exclusive operative contact with the gate layer, and the fourth contact via being disposed in exclusive operative contact with the source layer.

2. The method according to claim 1, wherein the forming of the channel comprises etching a trench for channel region formation and one of:
   depositing channel material in the trench;
   epitaxially growing channel material in the trench; and
   forming a liner along sidewalls of the trench and epitaxially growing channel material within the liner.

3. The method according to claim 1, wherein the layering of the ReRAM cell sub-structure is executed in order of the source layer first, the gate layer second, the drain layer third and the ReRAM cell layer last.

4. The method according to claim 1, wherein:
   the forming of the channel is executed such that the channel comprises multiple edges;
   the layering of the ReRAM cell sub-structure is executed such that the ReRAM cell, the drain, the gate and the source layers extend outwardly from each of the multiple edges of the channel with successively increasing distances; and
   the building of the contact via sub-structure is executed such that the contact via sub-structure is provided as an individual contact via sub-structure with a linear formation at each of the multiple edges.

5. The method according to claim 4 further comprising:
   disposing a word line in operative contact with each of the first contact vias of each of the individual contact via sub-structures;
   disposing a first bit line in operative contact with each of the fourth contact vias of each of the individual contact via sub-structures;
   disposing a second bit line in operative contact with each of the second contact vias of each of the individual contact via sub-structures; and
   disposing a gate line in operative contact with each of the third contact vias of each of the individual contact via sub-structures.

6. The method according to claim 5, wherein:
   executing a current driven write operation comprises biasing the gate line, biasing the word line and the first bit line and forcing the second bit line to zero current or to have a same bias as the word line;
   executing a voltage driven write operation comprises grounding the gate line and the first bit line and applying positive and negative biases to the word line and the second bit line, respectively; and
   executing a read operation comprises grounding the gate line and the first bit line, biasing the word line and reading a current of the second bit line.

7. The method according to claim 1, wherein:
   the forming of the channel is executed such that the channel comprises multiple edges;
   the layering of the ReRAM cell sub-structure is executed such that the ReRAM cell, the drain, the gate and the source layers extend outwardly from each of the multiple edges of the channel with successively increasing distances; and the building of the contact via sub-structure is executed such that the contact via sub-structure is provided as an individual contact via sub-structure with a spiral formation at each of the multiple edges.

8. The method according to claim 7 further comprising interposing insulating bodies between neighboring individual contact via sub-structures.

9. The method according to claim 7 further comprising:
   disposing a word line in operative contact with each of the first contact vias of each of the individual contact via sub-structures;
   disposing a first bit line in operative contact with each of the fourth contact vias of each of the individual contact via sub-structures;
   disposing a second bit line in operative contact with each of the second contact vias of each of the individual contact via sub-structures; and
   disposing a gate line in operative contact with each of the third contact vias of each of the individual contact via sub-structures.

10. The method according to claim 9, wherein:
   executing a current driven write operation comprises biasing the gate line, biasing the word line and the first bit line and forcing the second bit line to zero current or to have a same bias as the word line;
   executing a voltage driven write operation comprises grounding the gate line and the first bit line and applying positive and negative biases to the word line and the second bit line, respectively; and executing a read operation comprises grounding the gate line and the first bit line, biasing the word line and reading a current of the second bit line.

* * * * *